US011337329B2

(12) United States Patent
Chen et al.

(10) Patent No.: US 11,337,329 B2
(45) Date of Patent: May 17, 2022

(54) SINGLE-BLADE AIR DAMPER FOR RACK-MOUNTED CHASSIS

(71) Applicant: Dell Products, L.P., Round Rock, TX (US)

(72) Inventors: Yuxin Chen, Shanghai (CN); Jie Yang, Shanghai (CN); Qingqiang Guo, Shanghai (CN)

(73) Assignee: Dell Products, L.P., Round Rock, TX (US)

( * ) Notice: Subject to any disclaimer, the term of this patent is extended or adjusted under 35 U.S.C. 154(b) by 74 days.

(21) Appl. No.: 16/927,221

(22) Filed: Jul. 13, 2020

(65) Prior Publication Data

US 2021/0410314 A1 Dec. 30, 2021

(30) Foreign Application Priority Data

Jun. 24, 2020 (CN) .......................... 202010595831.3

(51) Int. Cl.
*H05K 7/00* (2006.01)
*H05K 7/14* (2006.01)
*H05K 5/02* (2006.01)
*H05K 7/20* (2006.01)

(52) U.S. Cl.
CPC ......... *H05K 7/1487* (2013.01); *H05K 5/0213* (2013.01); *H05K 5/0226* (2013.01); *H05K 7/1489* (2013.01); *H05K 7/20145* (2013.01)

(58) Field of Classification Search
None
See application file for complete search history.

(56) References Cited

U.S. PATENT DOCUMENTS

| | | | | |
|---|---|---|---|---|
| 5,933,400 A * | 8/1999 | Kabasawa | ............ | G11B 17/057 |
| | | | | 360/99.06 |
| 6,621,692 B1 * | 9/2003 | Johnson | ............... | H05K 7/1421 |
| | | | | 361/679.55 |
| 6,671,245 B2 * | 12/2003 | Wada | .................. | G11B 17/0405 |
| | | | | 720/657 |
| 7,108,530 B2 * | 9/2006 | Kimura | .................. | H01R 27/00 |
| | | | | 361/755 |
| 9,389,651 B2 * | 7/2016 | Brockett | ................. | G06F 1/187 |
| 9,491,884 B2 * | 11/2016 | Chung | ................. | H05K 7/1487 |
| 9,518,414 B1 * | 12/2016 | Chen | ..................... | E05D 11/082 |

(Continued)

*Primary Examiner* — Anthony Q Edwards
*Assistant Examiner* — Rashen E Morrison
(74) *Attorney, Agent, or Firm* — Fogarty LLP

(57) ABSTRACT

The front of a rack-mounted 2 RU (Rack Unit) chassis includes bays that receive replaceable components, such as storage drives. Two rear slots of such chassis each receive hot-swappable 1 RU servers that couple to a midplane of the chassis. When a server is removed from its slot while the server in the other slot remains operational, the airflow output of the operational server escapes via the empty slot rather than cooling the components in the front-facing bays. Embodiments provide a single-blade air damper that blocks airflow via an empty chassis slot. The single-blade air damper is connected to spring assemblies on both chassis sidewalls. The spring assemblies are maintained in unstable states when servers are installed in both slots of the chassis. Upon a server being removed from a slot, the spring assemblies transition to stable states that position the single-blade air damper to block airflow via the empty slot.

20 Claims, 9 Drawing Sheets

(56) References Cited

U.S. PATENT DOCUMENTS

| | | | | |
|---|---|---|---|---|
| 9,652,001 | B2* | 5/2017 | Wang | G06F 1/187 |
| 9,681,576 | B2* | 6/2017 | Schroeder | A47B 88/57 |
| 9,743,547 | B1* | 8/2017 | Amin-Shahidi | G11B 33/08 |
| 9,763,350 | B2* | 9/2017 | Rust | H05K 7/1421 |
| 9,781,857 | B2* | 10/2017 | Jau | G06F 1/183 |
| 9,795,050 | B2* | 10/2017 | Chen | H05K 7/1487 |
| 9,816,304 | B2* | 11/2017 | Wells | E05D 11/10 |
| 10,031,308 | B2* | 7/2018 | Williams | G02B 6/4454 |
| 10,278,298 | B2* | 4/2019 | De Vis | G02B 6/00 |
| 11,099,613 | B1* | 8/2021 | Chen | G06F 1/183 |
| 2002/0181197 | A1* | 12/2002 | Huang | H05K 7/1421 |
| 2002/0181380 | A1* | 12/2002 | Wada | G11B 17/057 |
| | | | | 720/628 |
| 2010/0214733 | A1* | 8/2010 | Suffern | H05K 7/20145 |
| | | | | 361/679.46 |
| 2010/0310225 | A1* | 12/2010 | Anderson | H04Q 1/064 |
| | | | | 385/135 |
| 2011/0228473 | A1* | 9/2011 | Anderson | H05K 7/1487 |
| | | | | 361/679.02 |
| 2013/0301225 | A1* | 11/2013 | Gong | H05K 7/1491 |
| | | | | 361/826 |
| 2013/0342990 | A1* | 12/2013 | Jau | G06F 1/18 |
| | | | | 361/679.39 |
| 2015/0015131 | A1* | 1/2015 | Privitera | G06F 1/187 |
| | | | | 312/309 |
| 2020/0264672 | A1* | 8/2020 | Morino | G06F 1/1637 |

* cited by examiner

SINGLE-BLADE AIR DAMPER FOR RACK-MOUNTED CHASSIS

FIELD

This disclosure relates generally to Information Handling Systems (IHSs), and more specifically, to airflow cooling utilized by IHSs.

BACKGROUND

As the value and use of information continues to increase, individuals and businesses seek additional ways to process and store information. One option is an Information Handling System (IHS). An IHS generally processes, compiles, stores, and/or communicates information or data for business, personal, or other purposes. Because technology and information handling needs and requirements may vary between different applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, global communications, etc. In addition, IHSs may include a variety of hardware and software components that may be configured to process, store, and communicate information and may include one or more computer systems, data storage systems, and networking systems.

Groups of IHSs may be housed within data center environments. A data center may include a large number of IHSs, such as servers that are installed within chassis and stacked within slots provided by racks. A data center may include large numbers of such racks that may be organized into rows in a manner that allows administrators to access IHS components via the front and back of a rack. In some instances, administrators may be able to service and replace components of a rack-mounted IHS while the IHS remains operational and installed within the rack. Such replaceable components may be referred to as being hot-pluggable. An administrator may also be able to re-configure aspects of the operation of a rack-mounted IHS through the coupling and de-coupling of cables to the various connectors that may be provided on the back of a chassis of an IHS. In other instances, administrators may remove an IHS from operation in order to service or replace some of its internal components.

In many instances, rack systems are constructed using standardized dimensions that define vertical and horizontal dimensions for components, such as server IHSs, that are installed within such racks. Standardized rack dimensions specify vertical units of space within a rack, where such vertical units of rack space are commonly referred to as RUs (Rack Units). In some instances, a chassis may be one rack unit (1 RU) in height and may house a single IHS, such as a server. In other instances, a chassis be multiple rack units in height and the chassis may include multiple IHSs. For example, a 2 RU chassis may include a set of front bays that receive replaceable storage drives and may house two server IHSs that are each 1 RU in height. In such instances, each of the 1 RU servers may be separately administered and may themselves be replaceable components that may be coupled and de-coupled from a chassis. In some instances, such 1 RU servers are hot-swappable component, such that when one of the 1 RU servers is removed from a 2 RU chassis, the other 1 RU server may continue in operation

SUMMARY

In various embodiments, a chassis houses a first Information Handling System (IHS) and a second IHS. The chassis embodiments include: a lower slot that receives the first IHS; an upper slot that receives the second IHS; and a single-blade air damper that blocks airflow through the upper slot when the first IHS is removed from the upper slot and that blocks airflow through the lower slot when the second IHS is removed from the lower slot.

In additional chassis embodiments, the first IHS and the second IHS couple to a midplane of the chassis and wherein the chassis comprises a plurality of front-facing bays. In additional chassis embodiments, the single-blade air damper comprises a left spring assembly attached to a left sidewall of the chassis and a right spring assembly attached to the right sidewall of the chassis. In additional chassis embodiments, the left spring assembly and the right spring assembly each comprise an unstable state and two stable states. In additional chassis embodiments, the left spring assembly and the right sprint assembly are maintained in the unstable state when the first IHS is installed in the lower slot and the second IHS is installed in the upper slot. In additional chassis embodiments, the single blade of the air damper is maintained between the first IHS and the second IHS when the left spring assembly and the right sprint assembly are maintained in the unstable state. In additional chassis embodiments, the left spring assembly and the right sprint assembly release from the unstable state to a lower stable state when the first IHS is removed from the lower slot. In additional chassis embodiments, the single blade of the air damper blocks airflow through the lower slot when the left spring assembly and the right sprint assembly are positioned in the lower stable state. In additional chassis embodiments, the left spring assembly and the right sprint assembly release from the unstable state to an upper stable state when the first IHS is removed from the upper slot. In additional chassis embodiments, the single blade of the air damper blocks airflow through the upper slot when the left spring assembly and the right sprint assembly are positioned in the upper stable state.

In various additional embodiments, systems include: a first IHS (Information Handling System) installed in the lower slot of a chassis; a second IHS installed in the upper slot of the chassis; and a chassis comprising the upper slot that receives the first IHS and further comprising the lower slot that receives the second IHS, wherein the chassis further comprises a single-blade air damper that blocks airflow through the lower slot when the first IHS is removed from the lower slot and that blocks airflow through the upper slot when the second IHS is removed from the upper slot.

In additional system embodiments, the first IHS and the second IHS couple to a midplane of the chassis and wherein the chassis further comprises a plurality of front-facing bays. In additional system embodiments, the airflow that is blocked by the single-blade air damper when the first IHS is installed in the lower slot is airflow generated, at least in part, by the second IHS that remains operational in the upper slot. In additional system embodiments, the single-blade air damper comprises a left spring assembly attached to a left sidewall of the chassis and a right spring assembly attached to the right sidewall of the chassis. In additional system embodiments, the left spring assembly and the right spring assembly each comprise an unstable state and two stable states, wherein the two stable states correspond to positions blocking airflow through an empty slot of the chassis.

In various additional embodiments, methods are provided for supporting cooling in a chassis capable of hosting a plurality of IHSs (Information Handling Systems). The methods include: inserting a first IHS within a lower slot of the chassis; inserting the second IHS within an upper slot of the chassis, wherein the insertion of the second IHS in the upper slot positions a single-blade air damper within a horizontal gap between the first IHS and the second IHS; removing the first IHS from the lower slot of the chassis, wherein the removal of the first IHS releases the single-blade air damper, wherein the released single-blade air damper blocks airflow through the lower slot of the chassis; replacing the first IHS in the lower slot of the chassis; wherein the replacement of the first IHS in the lower slot re-positions the single-blade air damper within the horizontal gap between the first IHS and the second IHS; and removing the second IHS from the upper slot of the chassis, wherein the removal of the second IHS releases the single-blade air damper, wherein the released single-blade air damper blocks airflow through the upper slot of the chassis.

In additional method embodiments, the first IHS and the second IHS couple to a midplane of the chassis and wherein the chassis comprises a plurality of front-facing bays. In additional method embodiments, the single-blade air damper comprises a left spring assembly attached to a left sidewall of the chassis and a right spring assembly attached to the right sidewall of the chassis. In additional method embodiments, the left spring assembly and the right spring assembly each comprise an unstable state and two stable states. In additional method embodiments, the two stable states correspond to positions blocking airflow through an empty slot of the chassis.

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity, and have not necessarily been drawn to scale.

DETAILED DESCRIPTION

Figure 1:
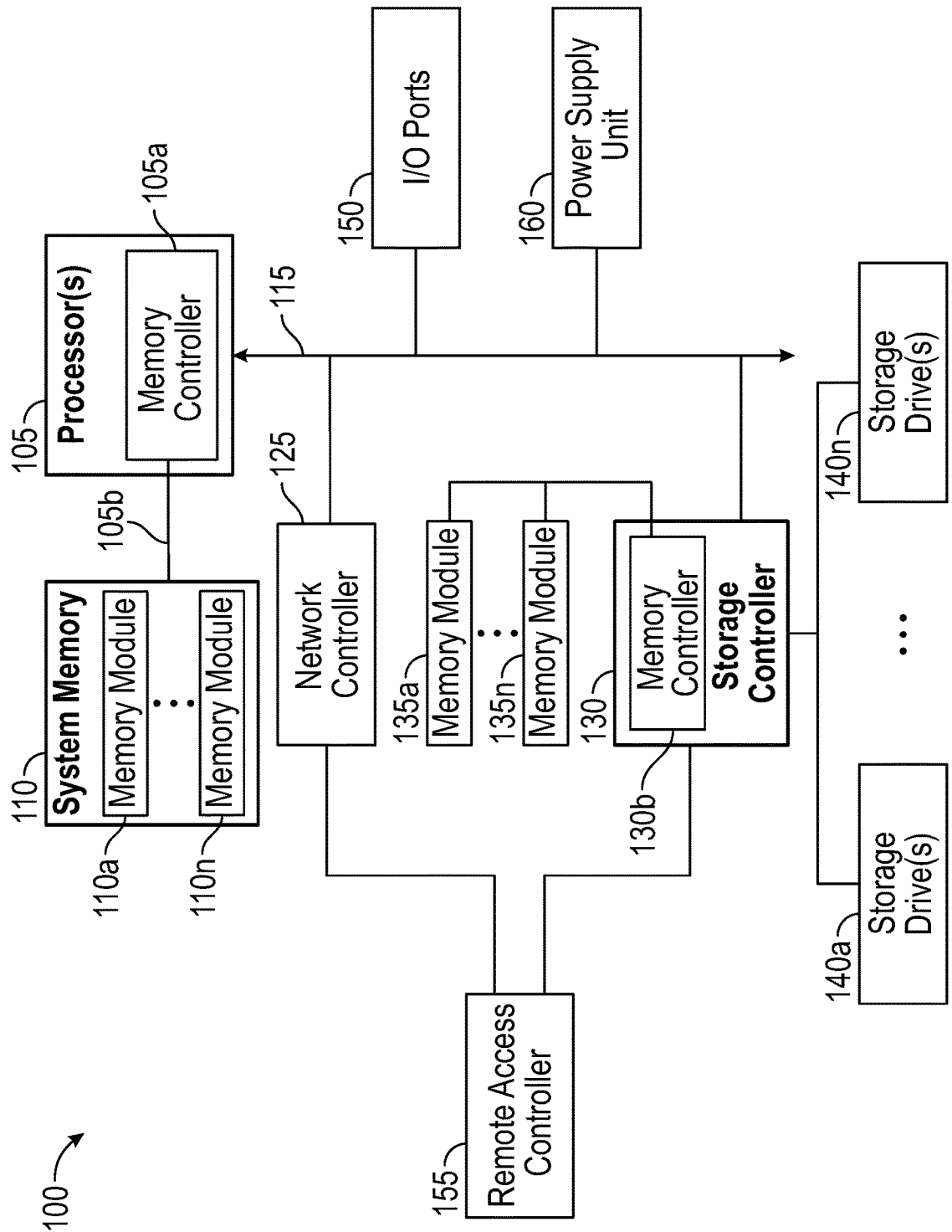
FIG. 1 is a diagram illustrating certain components of an IHS for use in a rack-mounted chassis that includes a single-blade air damper according to embodiments.

For purposes of this disclosure, an IHS may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an IHS may be a personal computer (e.g., desktop or laptop), tablet computer, mobile device (e.g., Personal Digital Assistant (PDA) or smart phone), server (e.g., blade server or rack server), a network storage device, or any other suitable device and may vary in size, shape, performance, functionality, and price. An IHS may include Random Access Memory (RAM), one or more processing resources, such as a Central Processing Unit (CPU) or hardware or software control logic, Read-Only Memory (ROM), and/or other types of nonvolatile memory. Additional components of an IHS may include one or more disk drives, one or more network ports for communicating with external devices as well as various I/O devices, such as a keyboard, a mouse, touchscreen, and/or a video display. An IHS may also include one or more buses operable to transmit communications between the various hardware components. An example of an IHS is described in more detail below. It should be appreciated that although certain IHSs described herein may be discussed in the context of enterprise computing servers, other embodiments may be utilized.

As described, in a data center environment, a server IHS may be installed within a chassis, in some cases along with other similar server IHSs. A rack may house multiple such chassis and a data center may house numerous racks. Each rack may host a large number of IHSs that are installed as components of a chassis and multiple chassis are stacked and installed within racks. In certain instances, the front-side of such rack-mounted chassis may include one or more bays that each receive an individual replaceable component, such as a storage drive. Some rack-mounted chassis may be multiple rack units in height and may house multiple IHSs. For example, a 2 RU chassis may house two 1 RU server IHSs. In such instances, the individual 1 RU sever IHSs may be replaceable components of the 2 RU chassis, with one 1 RU server installed in a lower slot of the chassis and the second 1 RU server installed in an upper slot of the chassis. A 1 RU sever may be extracted from its slot via the rear of such a 2 RU chassis and may replaced with a different 1 RU server that is also compatible with the slots of a 2 RU chassis.

In some instances, a 1 RU server may include an internal bank of fans that extends across a midplane of the server. The fans are operated to ventilate heated air from within the internal compartments of the server. For instance, the internal fans of a rack-mounted 1 RU server may draw in air from vents in the back of the sever and may ventilate heated air through gaps and vents in the front of the sever. In scenarios where a 2 RU chassis includes front-facing bays that house storage drives or other replaceable components, the exhaust from the airflow cooling of 1 RU servers housed within the chassis is ventilated via spaces between these front-facing bays, thus ventilating heated air away from the components installed in these bays. Without any other source of airflow cooling, the components installed in these front-facing bays of a 2 RU chassis rely on the cooling provided by the 1 RU servers installed in the upper and lower slots of the chassis. As described, some 1 RU servers may be hot-swappable components that may be removed from a slot in a 2 RU chassis while an 1 RU server in another slot of the chassis remains operational. When administered in this manner, the airflow output generated by the still operating 1 RU server tends to exit via the empty slot of the removed server rather than via the spaces of the front-facing bays of the 2 RU chassis. As a result of this reverse airflow path via the empty slot, the components of the front-facing bays may receive minimal airflow cooling. This reverse airflow pathway that results when a server is removed from a slot of a chassis may be blocked via dampers that block airflow through an open slot of a chassis.

FIG. 1 illustrating certain components of an IHS 100 for use in a rack-mounted chassis that includes a single-blade air damper according to embodiments. Although the embodiments provided herein describe an IHS that is a rack-mounted server, other embodiments may be implemented using other types of IHSs. In the illustrative embodiment of FIG. 1, IHS 100 may be a server that would typically be installed within a chassis, that in turn would be typically installed within slots of a rack. Installed in this manner, IHS 100 may utilize certain shared resources provided by the chassis and/or rack, such as power and networking. In some embodiments, multiple servers such as IHS 100 may be installed within a single chassis. For instance, IHS 100 may be a 1 RU server that is paired with a similar 1 RU component, such as another server similar to IHS 100, and may be installed with a 2 RU chassis.

IHS 100 may include one or more processors 105. In some embodiments, processors 205 may include a main processor and a co-processor, each of which may include a plurality of processing cores. As illustrated, processor(s) 105 may include an integrated memory controller 105a that may be implemented directly within the circuitry of the processor 105, or the memory controller 105a may be a separate integrated circuit that is located on the same die as the processor 105. The memory controller 105a may be configured to manage the transfer of data to and from the system memory 110 of the IHS 105 via a high-speed memory interface 105b.

System memory 110 may include memory components, such as such as static RAM (SRAM), dynamic RAM (DRAM), NAND Flash memory, suitable for supporting high-speed memory operations by the processor(s) 105. System memory 110 may combine both persistent, non-volatile memory and volatile memory. In certain embodiments, the system memory 110 may be comprised of multiple removable memory modules. The system memory 110 of the illustrated embodiment includes removable memory modules 110a-n. Each of the removable memory modules 110a-n may utilize a form factor corresponding to a motherboard expansion card socket that receives a type of removable memory module 110a-n, such as a DIMM (Dual In-line Memory Module). Other embodiments of IHS system memory 110 may be configured with memory socket interfaces that correspond to different types of removable memory module form factors, such as a Dual In-line Package (DIP) memory, a Single In-line Pin Package (SIPP) memory, a Single In-line Memory Module (SIMM), and/or a Ball Grid Array (BGA) memory.

IHS 100 may operate using a chipset that may be implemented by integrated circuits that couple processor 105 to various other components of the motherboard of IHS 100. In some embodiments, all or portions of the chipset may be implemented directly within the integrated circuitry of an individual processor 105. The chipset may provide the processor(s) 105 with access to a variety of resources accessible via one or more buses 115. Various embodiments may utilize any number of buses to provide the illustrated pathways provided by the single illustrated bus 115. In certain embodiments, bus 115 may include a PCIe (PCI Express) switch fabric that is accessed via a root complex and coupled processor 105 to a variety of internal and external PCIe devices.

In various embodiments, a variety of resources may be coupled to the processor(s) 105 of the IHS 100 via buses 115 managed by the processor chipset. In some cases, these resources may be components of the motherboard of IHS 100 or these resources may be resources coupled to IHS 100, such as via I/O ports 150. In some embodiments, IHS 100 may include one or more I/O ports 150, such as PCIe ports, that may be used to couple the IHS 100 directly to other IHSs, storage resources or other peripheral components. In certain embodiments, the I/O ports 150 may provide couplings to a backplane or midplane of the chassis in which the IHS 100 is installed. In some instances, I/O ports 150 may include rear-facing externally accessible connectors by which external systems and networks may be coupled to IHS 100.

As illustrated, IHS 100 may also include a power supply unit 160 that provides the components of the chassis with appropriate levels of DC power. The power supply unit 160 may receive power inputs from an AC power source or from a shared power system that is provided by a rack within which IHS 100 may be installed. In certain embodiments, power supply unit 160 may be implemented as a swappable component that may be used to provide IHS 100 with redundant, hot-swappable power supply capabilities.

As illustrated, processor(s) 105 may also be coupled to a network controller 125, such as provided by a Network Interface Controller (NIC) that is coupled to the IHS 100 and allows the IHS 100 to communicate via an external network, such as the Internet or a LAN. Network controller 125 may include various microcontrollers, switches, adapters, and couplings used to connect IHS 100 to a network, where such connections may be established by IHS 100 directly or via shared networking components and connections provided by a rack in which chassis 100 is installed. In some embodiments, network controller 125 may allow IHS 100 to interface directly with network controllers from other nearby IHSs in support of clustered processing capabilities that utilize resources from multiple IHSs.

IHS 100 may include one or more storage controllers 130 that may be utilized to access storage drives 140a-n that are accessible via the chassis in which IHS 100 is installed. Storage controllers 130 may provide support for RAID (Redundant Array of Independent Disks) configurations of logical and physical storage drives 140a-n. In some embodiments, storage controller 155 may be an HBA (Host Bus Adapter) that provides limited capabilities in accessing physical storage drives 140a-n. In many embodiments, storage drives 140a-n may be replaceable, hot-swappable storage devices that are installed within bays provided by the chassis in which IHS 100 is installed. In some embodiments, storage drives 140a-n may also be accessed by other IHSs that are also installed within the same chassis as IHS 100. For instance, when installed within a 2 RU chassis, IHS 100 may be a 1 RU component of the chassis that is able to access storage drives 140a-n along with another 1 RU IHS that is also installed within a slot of the 2 RU chassis. Although a single storage controller 130 is illustrated in FIG. 1, IHS 100 may include multiple storage controllers that may operate similarly to storage controller 130. In embodiments where storage drives 140a-n are hot-swappable devices that are received by bays of chassis, the storage drives 140a-n may be coupled to IHS 100 by couplings the bays of the chassis to a midplane of IHS 100. In various embodiments, storage drives 140a-n may include SAS (Serial Attached SCSI) magnetic disk drives, SATA (Serial Advanced Technology Attachment) magnetic disk drives, solid-state drives (SSDs) and other types of storage drives in various combinations.

As with processor(s) 105, storage controller 130 may also include an integrated memory controller 130b that may be used to manage the transfer of data to and from one or more memory modules 135a-n via a high-speed memory interface. Through use of memory operations implemented by memory controller 130b and memory modules 135a-n, storage controller 130 may operate using cache memories in support of storage operations. Memory modules 135a-n may include memory components, such as such as static RAM (SRAM), dynamic RAM (DRAM), NAND Flash memory, suitable for supporting high-speed memory operations and may combine both persistent, non-volatile memory and volatile memory. As with the system memory 110, the memory modules 135a-n may utilize a form factor corresponding to a memory card socket, such as a DIMM (Dual In-line Memory Module).

As illustrated, IHS 100 includes a remote access controller (RAC) 155 that provides capabilities for remote monitoring and management of various aspects of the operation of IHS 100. In support of these monitoring and management functions, remote access controller 155 may utilize both in-band and sideband (i.e., out-of-band) communications with various internal components of IHS 100. Remote access controller 155 may additionally implement a variety of management capabilities. In some instances, remote access controller 155 operate from a different power plane from the processors 105, storage drives 140a-n and other components of IHS 100, thus allowing the remote access controller 155 to operate, and management tasks to proceed, while the processing cores of IHS 100 are powered off. Various BIOS functions, including launching the operating system of the IHS 100, may be implemented by the remote access controller 155. In some embodiments, the remote access controller 155 may perform various functions to verify the integrity of the IHS 100 and its hardware components prior to initialization of the IHS 100 (i.e., in a bare-metal state).

In various embodiments, an IHS 100 does not include each of the components shown in FIG. 1. In various embodiments, an IHS 100 may include various additional components in addition to those that are shown in FIG. 1. Furthermore, some components that are represented as separate components in FIG. 1 may in certain embodiments instead be integrated with other components. For example, in certain embodiments, all or a portion of the functionality provided by the illustrated components may instead be provided by components integrated into the one or more processor(s) 105 as a systems-on-a-chip.

Figure 2A:
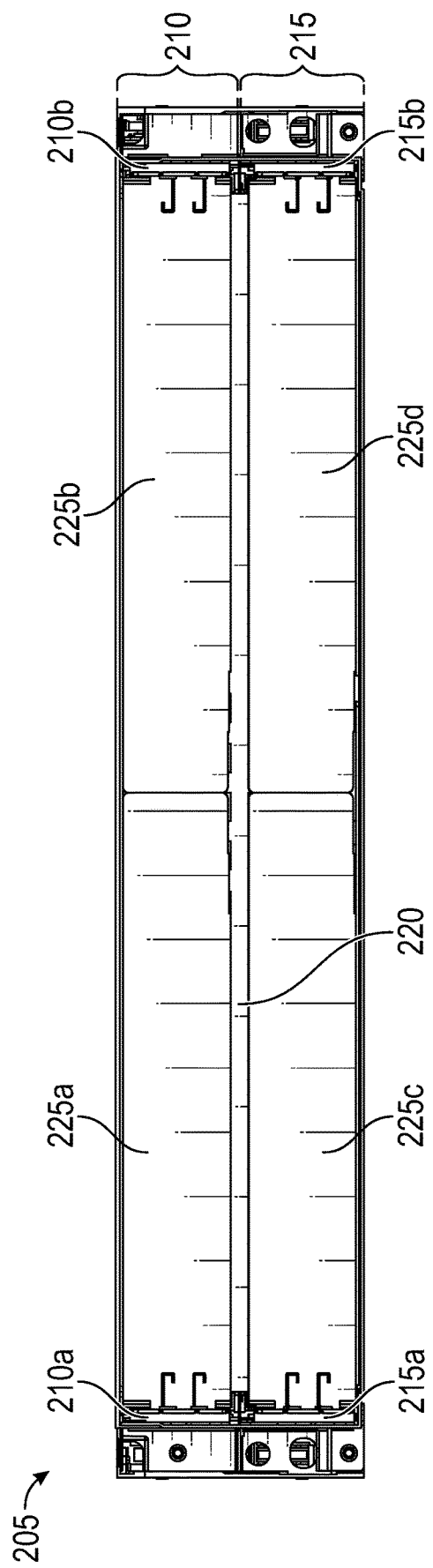
FIG. 2A is an illustration of an existing rack-mounted chassis that includes an air damper with four separate blades.

FIG. 2A is an illustration of an existing rack-mounted chassis 205 that includes an air damper with four separate blades. The illustrated 2 RU chassis 205 includes an upper slot 210 and a lower slot 215, where each slot may receive a 1 RU server. In FIG. 2A, both of the slots 210 and 215 are empty. FIG. 2A is a rear-facing view of the existing chassis 205, such as from the perspective of an administrator looking into the empty slots from the open back side of the chassis 205. With both of the slots 210, 215 of chassis 205 empty, the four blades 225a-d of the internal air damper of the chassis are all visible in deployed positions that block airflow via the slots 210, 215. Each of the four blades 225a-d of the air damper are separately attached to a sidewall of the chassis 205 via hinges 210a-b, 215a-b. For instance, the top left blade 225a of the damper is attached to the left side wall of chassis 205 via hinge 210a.

Figure 2B:
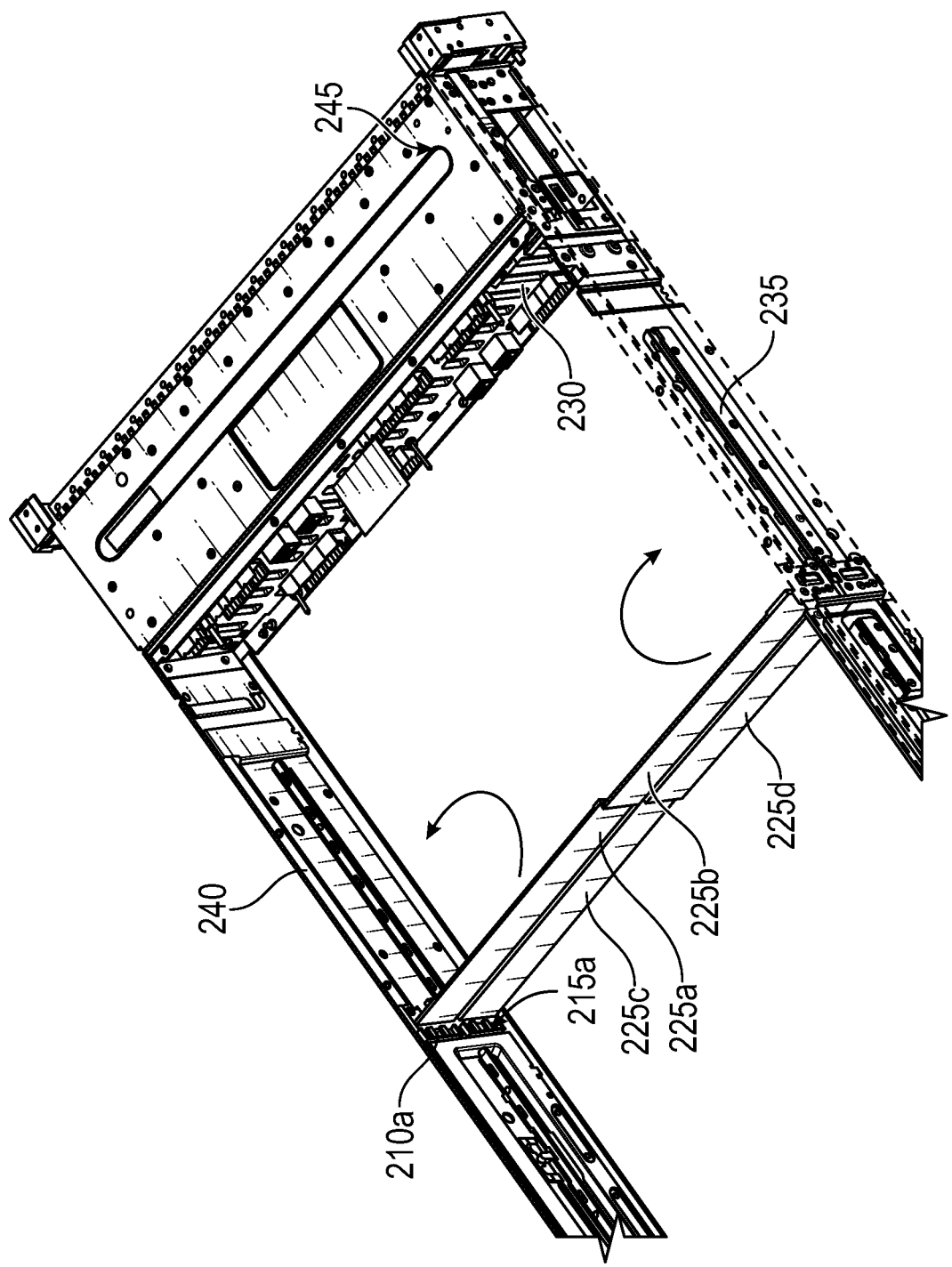
FIG. 2B is an additional illustration of the existing rack-mounted chassis of FIG. 2A that includes an air damper with four separate blades.

FIG. 2B is an additional illustration of the existing rack-mounted chassis of FIG. 2A that includes an air damper with four separate blades. FIG. 2B provides a top-down perspective of existing chassis 205, where the top cover of the chassis has been removed. As in FIG. 2A, the upper and lower slots of the chassis 205 are empty in FIG. 2B. As illustrated, chassis 205 includes a front-facing set of bays 245 in which removable components, such as storage drives, may be coupled. Chassis 205 also includes a midplane 230 that includes connectors that may with corresponding connectors of servers that are installed within the upper and lower slots 210, 215 of the chassis. An administrator may insert a 1 RU server in either the upper slot 210 or the lower slot 215 of chassis 205 by sliding the server into one of the slots from the back of the chassis, such as from the perspective illustrated in FIG. 2A.

By sliding a server into one of the slots of existing chassis 205, the server pushes the air dampers of that slot aside horizontally as the server is pushed into the slot, as indicated by the arrows in FIG. 2B. For instance, if an administrator slides a server into the top slot 210 of existing chassis 205, the top left blade 225a and the top right blade 225b of the air damper swing in the directions illustrated in FIG. 2B. The administrator continues pushing the server into the slot until its front-facing connectors are coupled with corresponding connectors provided by the midplane 230 of the chassis. In this installed position, the air dampers are pressed against their respective sidewalls. For instance, the insertion of a server in the top slot 210 of the existing chassis 205 results in top left blade 225a pressed against the left side wall 240 of the chassis and the top right blade 225b pressed against the right side wall 255 of the chassis.

In the scenario where a server has been installed in the top slot 210 of existing chassis 205, the bottom slot 215 air damper blades 225c-d remain deployed as illustrated in FIG. 2A. Deployed in this manner, the air damper blades 225c-d reduce the amount of reverse airflow that would otherwise occur via the empty lower slot 215. Without any air damper in the bottom slot 215, at least a portion of the airflow generated by the server in the top slot 210 would escape via the empty lower slot 215, rather than provide ventilation to the components installed in the forward facing bays 245 of the chassis 205. Accordingly, the hinges 210a-b, 215a-b may include springs that are loaded when a server is installed in one of the slots 210, 215 and the blades 225a-d are pressed against the respective sidewalls 240, 235 of the chassis. Upon removing the server from a slot, the springs of these hinges are free to unload, thus swinging the blades 225a-d back into their blocking positions shown in FIGS. 2A-B, thereby reducing reverse airflows via the empty slot.

As illustrated in FIG. 2A, a gap 220 is present between the upper-slot blades 225a-b and the lower-slot blades 225c-d of existing chassis 205. Such gaps 220 provide a pathway for reverse airflows, even when the air damper blades 225a-d are deployed in the illustrated position that is intended to block such reverse airflows. Such gaps 220 between the upper blades 225a-b and the lower blades 225c-d cannot be eliminated entirely due to the need for the damper blades to rotate freely without contacting each other and without contacting a server as the server is inserted and removed from an adjacent slot. Attempts to eliminate this gap 220, such as by adding pliable draft protectors to the blades, are complicated by the fact that servers may be inserted and removed in any order within the upper and lower slots 210, 215. For instance, a draft protector that is used to eliminate gap 220 may get pinched or caught in a manner that results in binding, which could lead to damage to the damper blades, the hinges and/or servers.

Figure 3A:
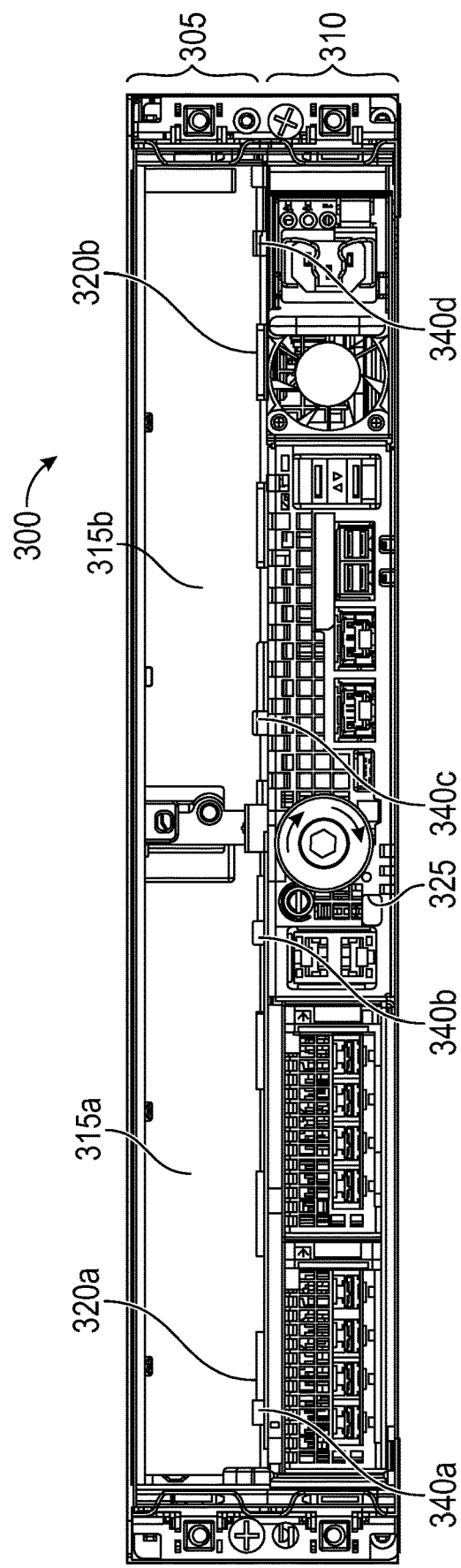
FIG. 3A is an illustration of an additional existing rack-mounted chassis that includes an air damper with four separate blades.

FIG. 3A is an illustration of an additional existing rack-mounted chassis 300 that also includes an air damper with four separate blades. In the existing chassis of FIGS. 2A and 2B, pairs of the four air damper blades 225a-d are displaced horizontally by inserting a server in one of the slots of the chassis. The existing chassis 300 of FIGS. 3A and 3B also includes four damper blades, but the damper blades of chassis 300 are displaced vertically by the insertion of a server. Similar to the rear-facing view of FIG. 2A, FIG. 3A depicts a rear-facing view of existing chassis 300, such as from the perspective of an administrator accessing the rear of the chassis 300 in order to insert or remove a server from one of the slots 305 or 310 of the chassis. As illustrated, a server 325 is installed in the lower slot 310 of the existing chassis 300. Also as illustrated, the upper slot 305 is blocked by air damper blades 315a and 315b. In this configuration, the airflow generated by the server 325 in the lower slot 310 is blocked by blades 315a and 315b from escaping via the empty upper slot 305.

Figure 3B:
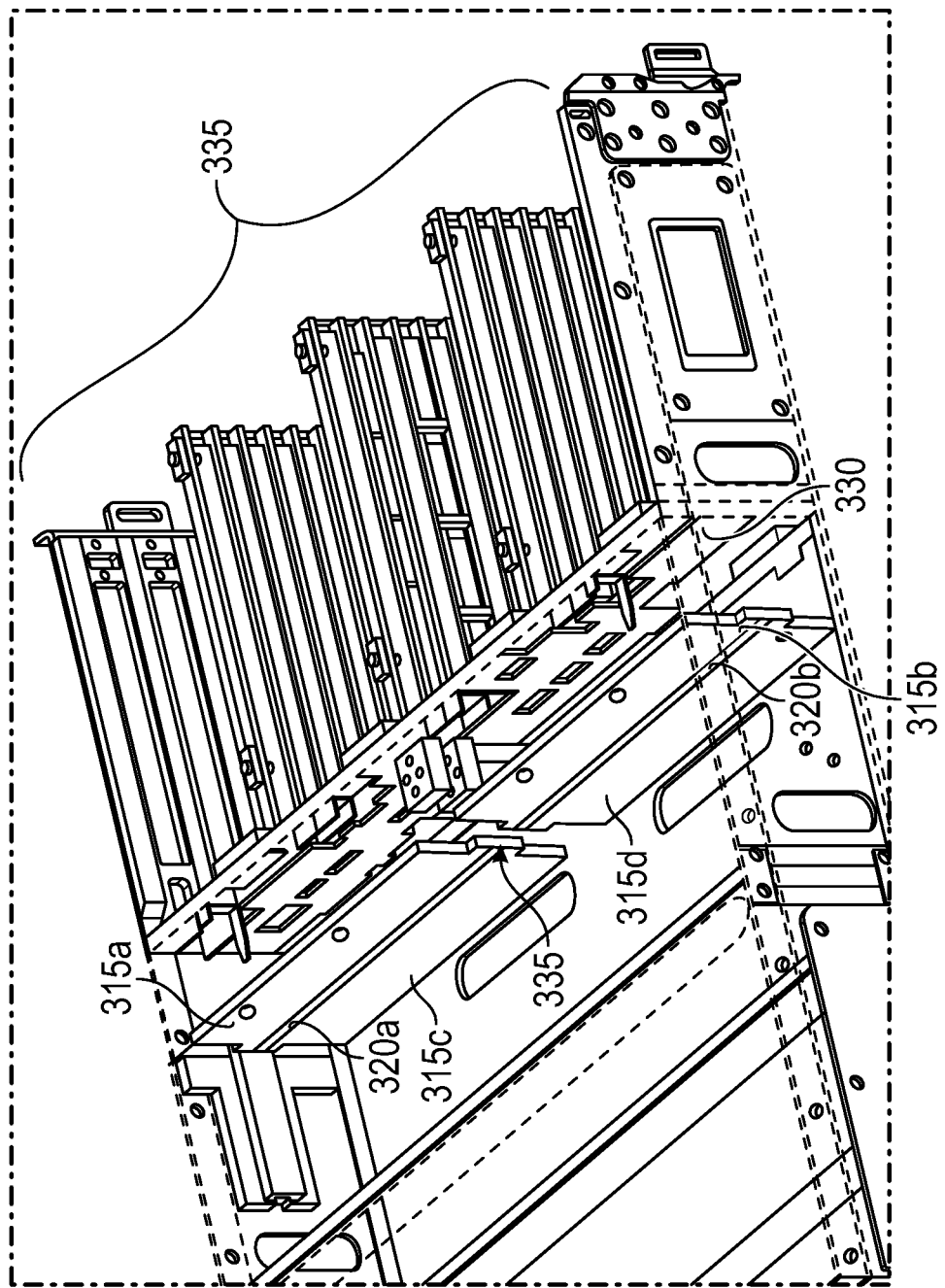
FIG. 3B is an additional illustration of the existing rack-mounted chassis of FIG. 3A that includes an air damper with four separate blades.

FIG. 3B is an additional illustration of the existing rack-mounted chassis 300 of FIG. 3A that includes an air damper with four separate blades. In the elevated side view of FIG. 3B, the existing chassis 300 is illustrated without an outer cover. A server may be installed in one of the slots 310 or 315 of chassis 300 by inserting the server in one of the slots and pushing the server forward until it is coupled to a midplane 330 of the chassis, thus providing connections to components installed in front drive bays 355 of the chassis. If a server is installed in the lower slot 310, the lower air damper blades 315c and 315d are each rotated upwards about hinges 320a and 320b, respectively. Similarly, if a server is installed in the upper slot 305, the upper air damper blades 315a and 315b are both rotated downwards about hinges 320a and 320b, respectively Hinges 320a and 320b may be spring loaded hinges that return the air dampers blades 315a-d to the blocking position illustrated in FIG. 3B upon a server being removed from its slot.

As with the existing chassis of FIGS. 2A and 2B, the four-blade air damper of FIGS. 3A and 3B also suffers from reduced effectiveness due to gaps that provide pathways for reverse airflow despite the blades being in a blocking position. As illustrated in FIG. 3B, a gap 335 is present between the left air damper blades 315a and 315c and the right air damper blades 315b and 315d. As with the four-damper chassis of FIGS. 2A and 2B, efforts to eliminate this gap 335 are frustrated by the need to prevent the left and right blades from binding in a manner that could damage the spring loaded hinges 320a-b that are used to return the blades to their blocking positions when a server is removed from the chassis. In addition, the use of spring-loaded hinges 320a-b results in additional gaps 340a-d that provide pathways for reverse airflow.

Figure 4:
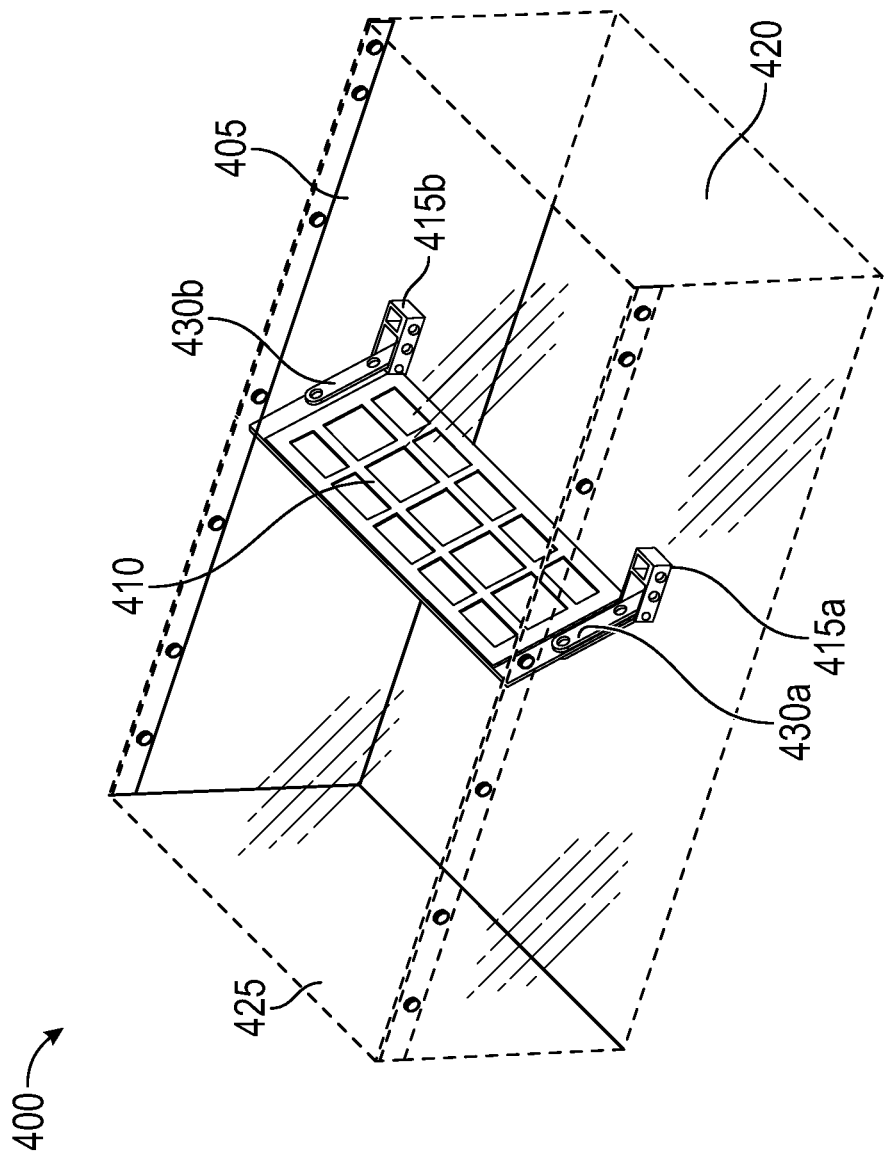
FIG. 4 is an illustration of certain components of a rack-mounted chassis according to embodiments that includes a single-blade air damper.

FIG. 4 is an illustration of certain components of a rack-mounted chassis 400 that includes a single-blade air damper according to embodiments. The illustrated chassis 400 includes an upper slot and a lower slot, with each slot receiving an IHS, such as a 1 RU server. The IHSs are inserted by an administrator into empty slots via an open rear side 420 of the chassis 400. The IHSs are pushed forward until they establish couplings with connectors on a midplane side 425 of the chassis 400. In the embodiment of FIG. 4, reverse airflows are prevented when an IHS is removed from its slot using a single-blade air damper. In FIG. 4, the single-blade air damper is illustrated in a position that blocks reverse airflow in the upper slot of the chassis 400.

In the illustrated embodiment, the air damper consists of a single blade 410 that may be formed from sheet metal, a plastic material or another suitable material. The blade 410 of the air damper is attached to a pair of arms 430a and 430b on each side of the blade 410. As described in additional detail below, the movement of the arms 430a and 430b serves to position the blade 410, such as in the illustrated upwards position of blade 410 that results when a server IHS is removed from the upper slot of chassis 400. Each of the arms 430a, 430b are attached to a spring assembly 415a-b that is fixed to one of the sidewalls of the chassis 400. As described in additional detail below, the action of these spring assemblies 415a-b includes two stable states in which the blade 410 is either blocking airflow in the upper slot, as illustrated in FIG. 4, or is blocking airflow in the lower slot. The action of these spring assemblies 415a-b also includes one non-stable state in which the blade 410 is maintained in a horizontal position by two IHSs that have been installed in the upper and lower slots of the chassis 400.

Figure 5A:
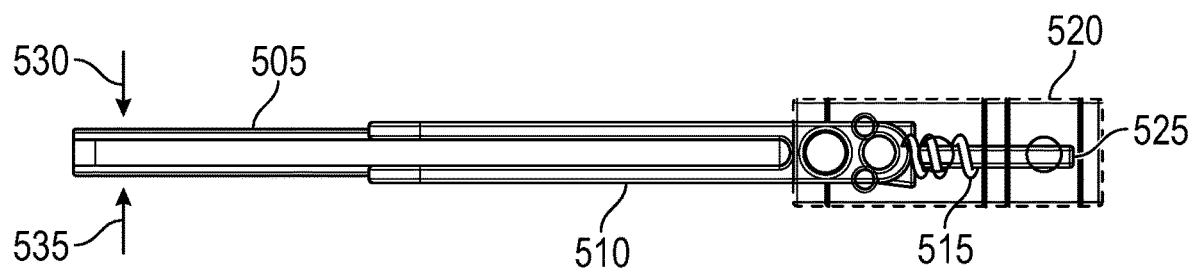
FIG. 5A is an illustration of the operation of a single-blade air damper of a chassis according to embodiments.
Figure 5B:
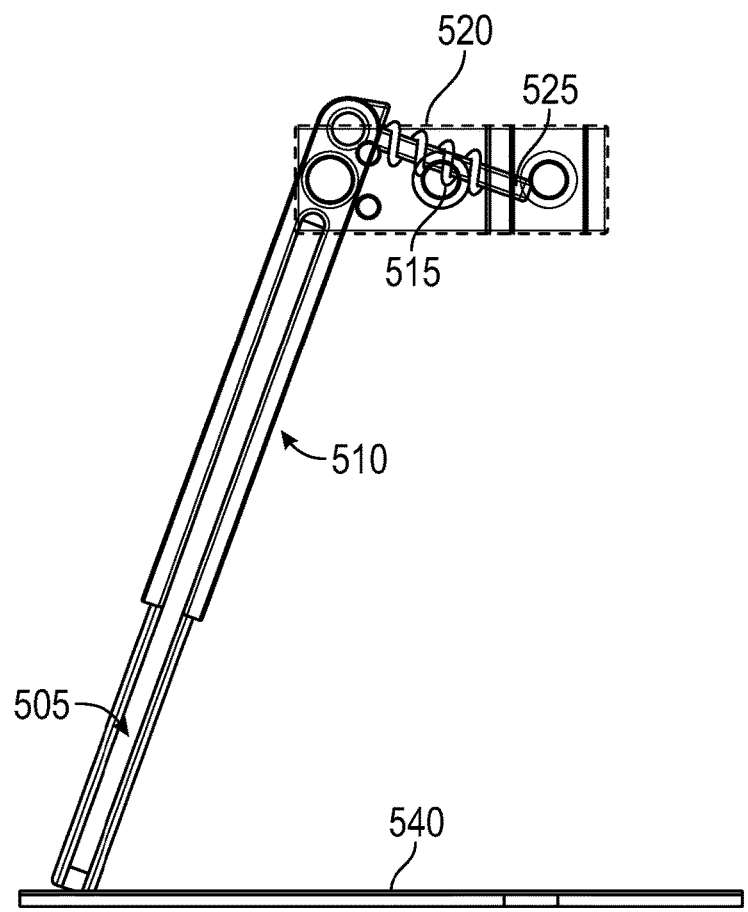
FIG. 5B is an illustration of additional operation of the single-blade air damper of FIG. 5A of a chassis according to embodiments.

FIG. 5A is an illustration of a single-blade air damper of a chassis according to embodiments. In FIG. 5A, the single-blade air damper is in a horizontal position that results from the downward force 530 of an IHS in the upper slot of a chassis and also from the upward force 535 of an IHS in the lower slot of the chassis. As described, the air damper consists of a single blade 505 that is fastened on each end to an arm 510. The movement of arm 510 and of the corresponding arm on the other end of blade 505 serves to move the blade between the lower position illustrated in FIG. 5B and the upper position illustrated in FIG. 5C. The movement of arm 510 is controlled by a spring mechanism that is housed within an assembly 520 that is attached to sidewall of the chassis.

The spring assembly 520 houses a shaft 525 that is connected to the blade arm 510. As illustrated, the shaft 525 is installed within a spring 515. In FIG. 5A, the spring 515 is loaded such that the shaft 525 is in an unstable state, but is held in place horizontally by the forces 530 and 535 generated respectively by the IHSs installed in the upper and lower slots of the chassis. Upon removal of an IHS from the lower slot of the chassis, force 535 is removed such that blade 550 is no longer restricted in the horizontal position of FIG. 5A. With this freedom of movement resulting from removal of the IHS in the lower slot, the unstable spring assembly is able to unload, thus rotating blade 505 to the position illustrated in FIG. 5B that blocks airflow through the lower slot.

Figure 5C:
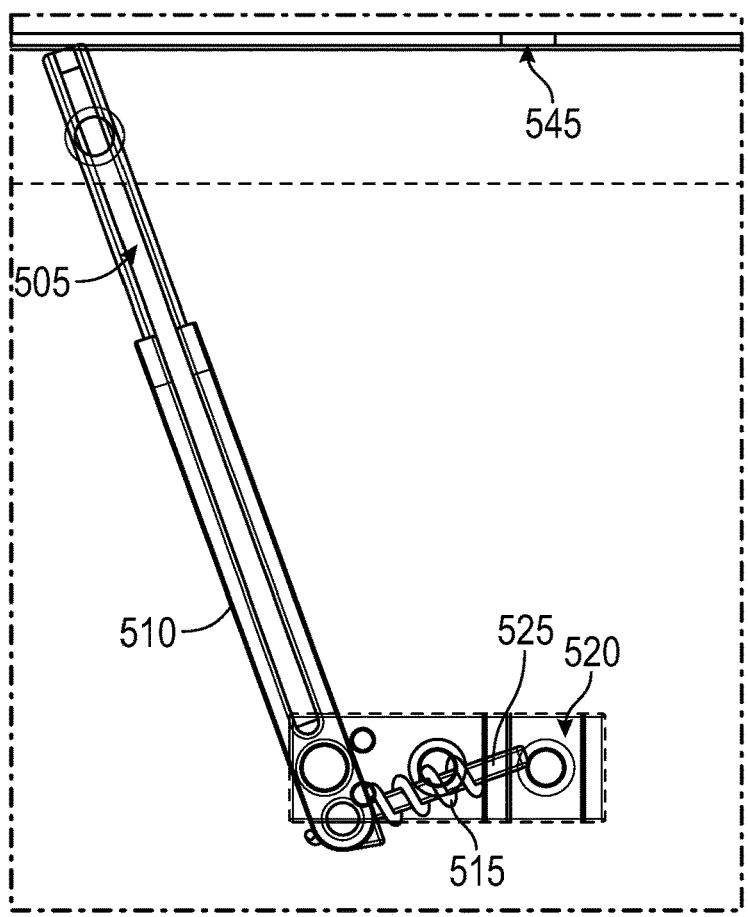
FIG. 5C is an illustration of additional operation of the single-blade air damper of FIGS. 5A and 5B of a chassis according to embodiments.
Figure 5D:
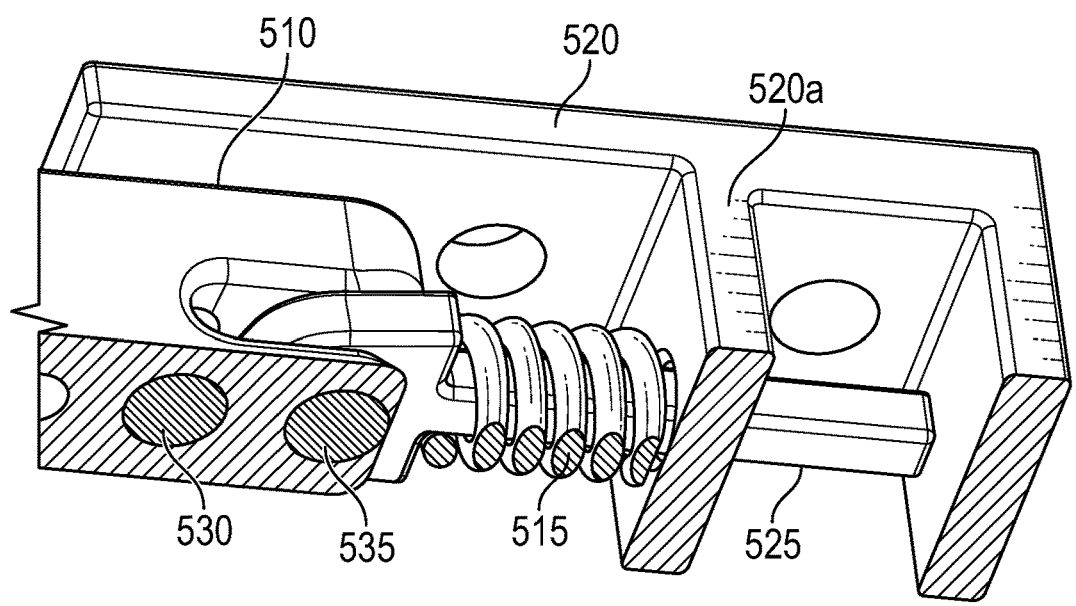
FIG. 5D is an illustration of additional operation of the single-blade air damper of FIGS. 5A, 5B and 5C of a chassis according to embodiments.

FIG. 5D provides a perspective of the unstable spring assembly state where the air damper arm and blade are in the horizontal position of FIG. 5A. As illustrated, the spring 515 of the assembly is installed on a cylindrical portion of shaft 525. When the spring assembly is in the unstable state of FIG. 5D, spring 515 is compressed between a protruding portion of the shaft 525 and a platform 520a of the spring assembly. When blade 505 is restricted to the horizontal position of FIG. 5A due to IHSs installed in both the upper and lower slots, spring 515 is loaded as illustrated in FIG. 5D. When an IHS is removed from the lower slot, spring 515 is allowed to unload such that arm 510 and blade 505 are rotated downward. As illustrated in FIG. 5D, a fastener 530 attaches arm 510 to the spring assembly 520, where the fastener 530 allows the arm 510 to pivot about the fastener. Also as illustrated, shaft 525 is similarly attached to arm 510 via a fastener 535 that allows the arm 510 and shaft 525 to rotate relative to each other. When an IHS is removed from the lower slot, spring 515 is free to unload such that the force of the unloading spring 515 pivots arm 510 downward about fastener 530, with shaft 525 pivoting upwards about fastener 535 to the position illustrated in FIG. 5B. The pivoting of shaft 525 in this manner serves to rotate arm 510 downwards, thus also rotating blade 505 downwards until it contacts the bottom surface 540 of the chassis. In this lower position, the blade 505 blocks reverse airflow through the empty lower slot of chassis. In this lower position, the spring assembly 520 is in a stable state with spring 515 unloaded, thus holding arm 510 and blade 505 in the downward position of FIG. 5B. When an IHS is reinserted in the lower slot of the chassis, it pushes blade 505 back to a horizontal position, thus reloading the spring assembly in the unstable state illustrated in FIGS. 5A and 5D.

If instead, an IHS is removed from the upper slot of the chassis, the unstable spring assembly of FIG. 5A unloads as illustrated in FIG. 5C due to the removal of force 530 generated by the IHS in the upper slot. The unloading of spring 515 now results in the pivoting of shaft 525 downwards as illustrated. The pivoting of shaft 525 now serves to rotate arm 510 upwards, thus also rotating blade 505 upwards until it contacts the upper surface 545 of the chassis. In this upper position, the blade 505 blocks reverse airflow through the empty upper slot of the chassis. In this upper position, the spring assembly 520 is in a stable state with spring 515 unloaded, thus holding the arm 510 in the illustrated position. In this manner, the action of the spring assembly 520 moves the blade 505 to the lower position of FIG. 5B and to the upper position of FIG. 5C.

Figure 6A:
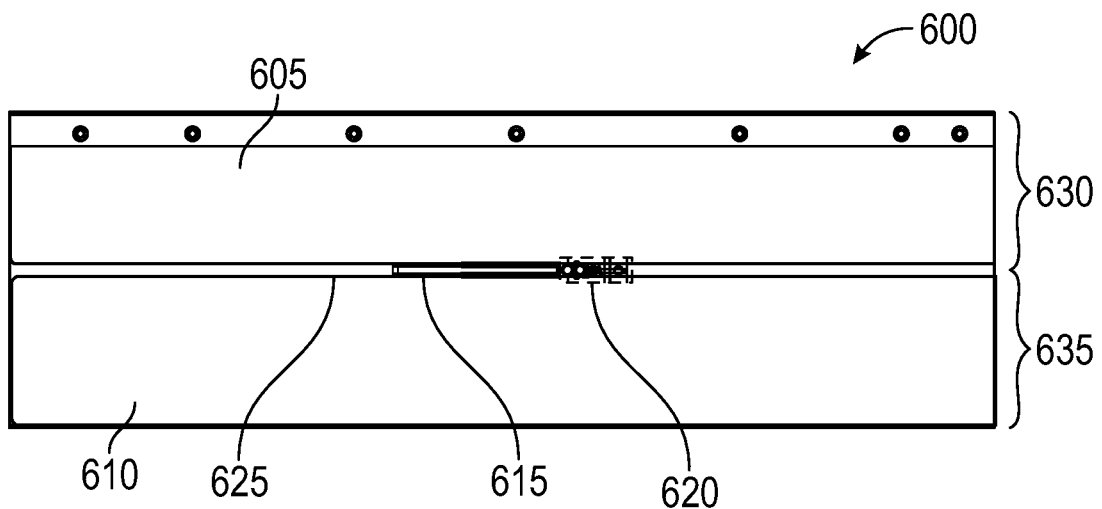
FIG. 6A is an illustration of a 2 RU chassis including a single-blade air damper according to embodiments.

FIG. 6A is a side-view illustration of a 2 RU chassis including a single-blade air damper according to embodiments. In FIG. 6A, an IHS 605, such as a server, is installed in the top slot 630 of chassis 600 and an IHS 610 is also installed in the bottom slot 635 of chassis 600. As described with regard to FIG. 5A, in this configuration the single-blade air damper 615 is in an unstable state, but is held in a horizontal position. As illustrated, in this horizontal position, the blade 615 and spring assembly 620 of the single-blade air damper 615 fit within the gap 625 between the two IHSs 605 and 610. As described, in this horizontal position, the spring assembly 620 of the air damper is in an unstable state, but movement of the blade 615 to a stable position is prevented by the two IHSs 605 and 610.

Figure 6B:
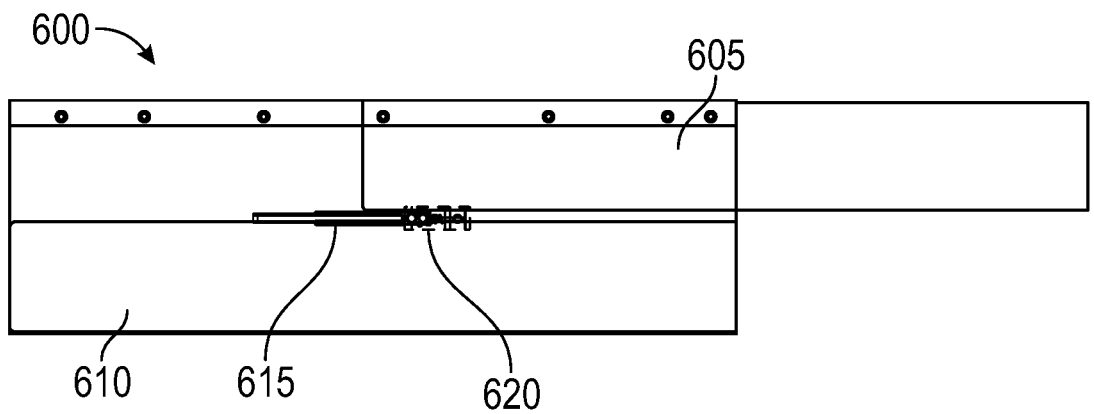
FIG. 6B is an additional illustration of the 2 RU chassis of FIG. 6A including operation of the single-blade air damper according to embodiments.
Figure 6C:
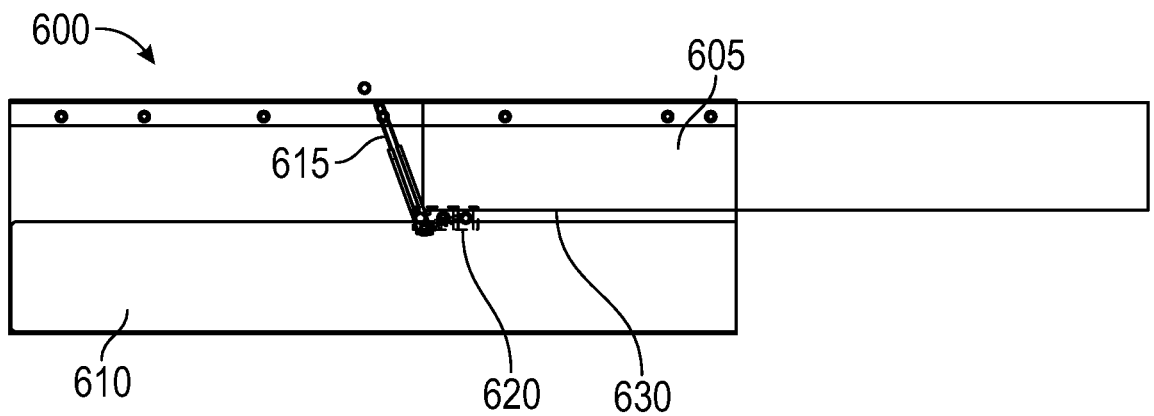
FIG. 6C is an additional illustration of the 2 RU chassis of FIGS. 6A and 6B including additional operation of the single-blade air damper according to embodiments.

In FIG. 6B, the same chassis 600 is illustrated, but IHS 605 is partially removed from the top slot 630 of the chassis while IHS 610 remains installed in the lower slot 635. The air damper remains in a horizontal position with a portion of the top IHS 605 still exerting a downward force on the blade 615. In FIG. 6C, IHS 605 has been further removed from the top slot 630 of the chassis 600, thus allowing spring assembly 620 to rotate blade 615 upwards. As described, the spring assembly 620 of the air damper is released from an unstable state by removal of an IHS from above or below air damper. Accordingly, in FIG. 6C, the spring of this assembly unloads such that the blade 615 rotates upwards into its illustrated position such that it blocks reverse airflow through the empty upper slot 630. Without the air damper 615 in this position, the airflow generated by IHS 610 in the lower slot 635 would escape via the empty upper slot 630 rather than ventilating heat from components installed in the front facing bays of the chassis 600. In some embodiments, protruding elements may be attached to the outer surfaces of IHSs 605 and 610 in order to facilitate movement of the air damper. For instance, a rubber or plastic protrusion may be attached to the lower surface of IHS 605 at position 630. As IHS 605 is being removed from the upper slot, such as illustrated in FIG. 6B, this protrusion at location 630 contacts the blade 615 of the damper. This movement of the damper caused by the protrusion serves to dislodge the spring assembly 620 from its current position, thus allowing the blade 615 to move upwards within the empty slot. With blade 615 now free to rotate, the spring of the assembly is able to unload to a stable state.

In this manner, a single-blade air damper prevents reverse airflow when an IHS has been removed from a slot of a chassis. Single-blade air damper embodiments provide improved blocking of reverse airflow when compared to the existing air dampers of FIGS. 2A-B and 3A-B. Existing air dampers utilize multiple blades, thus necessitating certain gaps between these blades in order to support their independent movement as servers are inserted and removed from the slots of a chassis. With a single-blade, air damper embodiments do not include such gaps, thus improving the ability of the single-blade air damper to prevent reverse airflow through an empty slot of a chassis.

It should be understood that various operations described herein may be implemented in software executed by processing circuitry, hardware, or a combination thereof. The order in which each operation of a given method is performed may be changed, and various operations may be added, reordered, combined, omitted, modified, etc. It is intended that the invention(s) described herein embrace all such modifications and changes and, accordingly, the above description should be regarded in an illustrative rather than a restrictive sense.

The terms "tangible" and "non-transitory," as used herein, are intended to describe a computer-readable storage medium (or "memory") excluding propagating electromagnetic signals; but are not intended to otherwise limit the type of physical computer-readable storage device that is encompassed by the phrase computer-readable medium or memory. For instance, the terms "non-transitory computer readable medium" or "tangible memory" are intended to encompass types of storage devices that do not necessarily store information permanently, including, for example, RAM. Program instructions and data stored on a tangible computer-accessible storage medium in non-transitory form may afterwards be transmitted by transmission media or signals such as electrical, electromagnetic, or digital signals, which may be conveyed via a communication medium such as a network and/or a wireless link.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. A chassis housing a first Information Handling System (IHS) and a second IHS, the chassis comprising:
   a lower slot, wherein the first IHS is inserted in the lower slot of the chassis;
   an upper slot, wherein the second IHS is inserted in the upper slot of the chassis, wherein the insertion of the second IHS in the upper slot positions a single-blade air damper within a horizontal gap between the first IHS and the second IHS; and
   the single-blade air damper that blocks airflow through the upper slot when the second IHS is removed from the upper slot, wherein the removal of the second IHS from the upper slot releases the single-blade air damper from within the horizontal gap between the first IHS and the second IHS such that the single-blade air damper blocks airflow through the upper slot, and wherein the single-blade air damper blocks airflow through the lower slot when the first IHS is removed from the lower slot, wherein the removal of the first IHS from the lower slot releases the single-blade air damper from within the horizontal gap between the first IHS and the second IHS such that the single-blade air damper blocks airflow through the lower slot.

2. The chassis of claim 1, wherein the first IHS couples to a midplane of the chassis when inserted in the lower slot of the chassis and wherein the second IHS couples to the midplane of the chassis when inserted in the upper slot of the chassis.

3. The chassis of claim 1, wherein the single-blade air damper comprises a left spring assembly attached to a left sidewall of the chassis and a right spring assembly attached to the right sidewall of the chassis.

4. The chassis of claim 3, wherein the left spring assembly and the right spring assembly each comprise an unstable state and two stable states.

5. The chassis of claim 4, wherein the left spring assembly and the right sprint assembly are maintained in the unstable state when the first IHS is installed in the lower slot and the second IHS is installed in the upper slot.

6. The chassis of claim 5, wherein the single blade of the air damper is maintained between the first IHS and the second IHS when the left spring assembly and the right sprint assembly are maintained in the unstable state.

7. The chassis of claim 4, wherein the left spring assembly and the right sprint assembly release from the unstable state to a lower stable state when the first IHS is removed from the lower slot.

8. The chassis of claim 7, wherein the single blade of the air damper blocks airflow through the lower slot when the left spring assembly and the right sprint assembly are positioned in the lower stable state.

9. The chassis of claim 4, wherein the left spring assembly and the right sprint assembly release from the unstable state to an upper stable state when the second IHS is removed from the upper slot.

10. The chassis of claim 9, wherein the single blade of the air damper blocks airflow through the upper slot when the left spring assembly and the right sprint assembly are positioned in the upper stable state.

11. A system comprising:
    a first IHS (Information Handling System) installed in a lower slot of a chassis;
    a second IHS installed in an upper slot of the chassis; and
    a chassis comprising the upper slot that receives the first IHS and further comprising the lower slot that receives the second IHS, wherein the chassis further comprises a single-blade air damper that blocks airflow through the lower slot when the first IHS is removed from the lower slot and that blocks airflow through the upper slot when the second IHS is removed from the upper slot, wherein the single-blade air damper is positioned within a horizontal gap between the first IHS and the second IHS when both the first IHS and the second IHS are installed in the IHS.

12. The system of claim 11, wherein the first IHS couples to a midplane of the chassis when installed in the lower slot of the chassis and wherein the second IHS couples to the midplane of the chassis when installed in the upper slot of the chassis.

13. The system of claim 11, wherein the airflow that is blocked by the single-blade air damper when the first IHS is installed in the lower slot is airflow generated, at least in part, by the second IHS that remains operational in the upper slot.

14. The system of claim 11, wherein the single-blade air damper comprises a left spring assembly attached to a left sidewall of the chassis and a right spring assembly attached to the right sidewall of the chassis.

15. The system of claim 14, wherein the left spring assembly and the right spring assembly each comprise an unstable state and two stable states, wherein the two stable states correspond to positions blocking airflow through an empty slot of the chassis.

16. A method for supporting airflow cooling in a chassis capable of hosting a plurality of IHSs (Information Handling Systems), the method comprising:
    inserting a first IHS within a lower slot of the chassis;
    inserting a second IHS within an upper slot of the chassis, wherein the insertion of the second IHS in the upper slot positions a single-blade air damper within a horizontal gap between the first IHS and the second IHS;
    removing the first IHS from the lower slot of the chassis, wherein the removal of the first IHS releases the single-blade air damper, wherein the released single-blade air damper blocks airflow through the lower slot of the chassis;
    replacing the first IHS in the lower slot of the chassis; wherein the replacement of the first IHS in the lower slot re-positions the single-blade air damper within the horizontal gap between the first IHS and the second IHS; and removing the second IHS from the upper slot of the chassis, wherein the removal of the second IHS releases the single-blade air damper, wherein the released single-blade air damper blocks airflow through the upper slot of the chassis.

17. The method of claim 16, wherein the first IHS and the second IHS couple to a midplane of the chassis and wherein the chassis comprises a plurality of front-facing bays.

18. The method of claim 16, wherein the single-blade air damper comprises a left spring assembly attached to a left sidewall of the chassis and a right spring assembly attached to the right sidewall of the chassis.

19. The method of claim 18, wherein the left spring assembly and the right spring assembly each comprise an unstable state and two stable states.

20. The method of claim 19, wherein the two stable states correspond to positions blocking airflow through an empty slot of the chassis.

* * * * *